(12) United States Patent
Sheperek et al.

(10) Patent No.: US 11,609,706 B2
(45) Date of Patent: Mar. 21, 2023

(54) READ SAMPLE OFFSET PLACEMENT

(71) Applicant: Micron Technology, Inc., Boise, ID (US)

(72) Inventors: Michael Sheperek, Longmont, CO (US); Bruce A. Liikanen, Berthoud, CO (US); Larry Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/507,915

(22) Filed: Jul. 10, 2019

(65) Prior Publication Data

US 2021/0011657 A1 Jan. 14, 2021

(51) Int. Cl.
*G06F 3/06* (2006.01)

(52) U.S. Cl.
CPC .......... *G06F 3/0659* (2013.01); *G06F 3/0604* (2013.01); *G06F 3/0673* (2013.01)

(58) Field of Classification Search
CPC ...... G06F 12/00; G06F 3/0659; G06F 3/0604; G06F 3/0673
USPC ........................................................ 711/154
See application file for complete search history.

(56) References Cited

U.S. PATENT DOCUMENTS

| | | | |
|---|---|---|---|
| 6,510,017 B1* | 1/2003 | Abdelnour | G11B 5/59627 360/77.04 |
| 2013/0227200 A1* | 8/2013 | Cometti | G06F 3/0629 711/103 |
| 2014/0040704 A1* | 2/2014 | Wu | G06F 11/1068 714/773 |
| 2014/0359202 A1* | 12/2014 | Sun | G06F 12/0246 711/103 |
| 2015/0085573 A1* | 3/2015 | Sharon | G11C 16/26 365/185.03 |
| 2016/0147582 A1* | 5/2016 | Karakulak | G06F 11/073 714/37 |
| 2017/0200505 A1* | 7/2017 | Jin | G11C 16/28 |
| 2018/0341552 A1* | 11/2018 | Liikanen | G11C 29/021 |

* cited by examiner

*Primary Examiner* — Gautam Sain
(74) *Attorney, Agent, or Firm* — Lowenstein Sandler LLP

(57) ABSTRACT

The present disclosure is directed to placement of samples of a read sample offset operation in a memory sub-system. A processing device determines a shape of a valley to be subject to a read sample offset operation, where the valley corresponds to at least one programming distribution of a memory sub-system. The processing device selects a sampling rule from a set of sampling rules based on the shape of the valley. The processing device executes the read sample offset operation in accordance with the sampling rule.

20 Claims, 10 Drawing Sheets

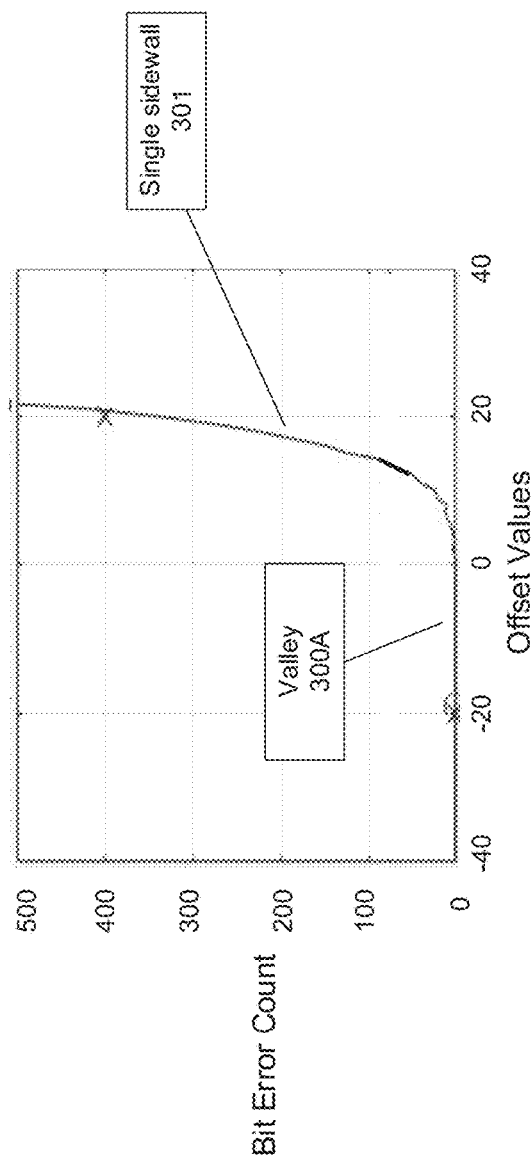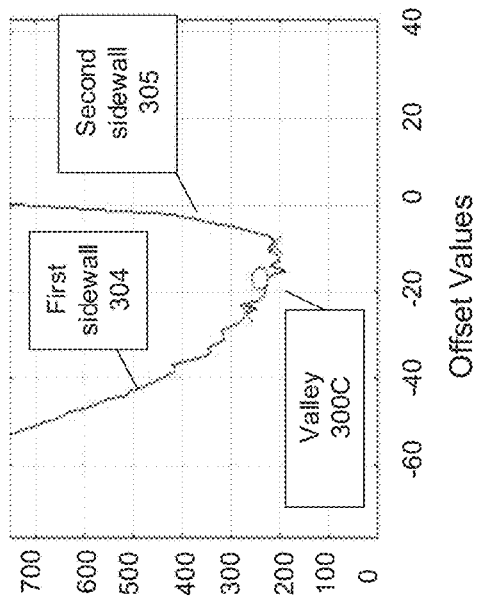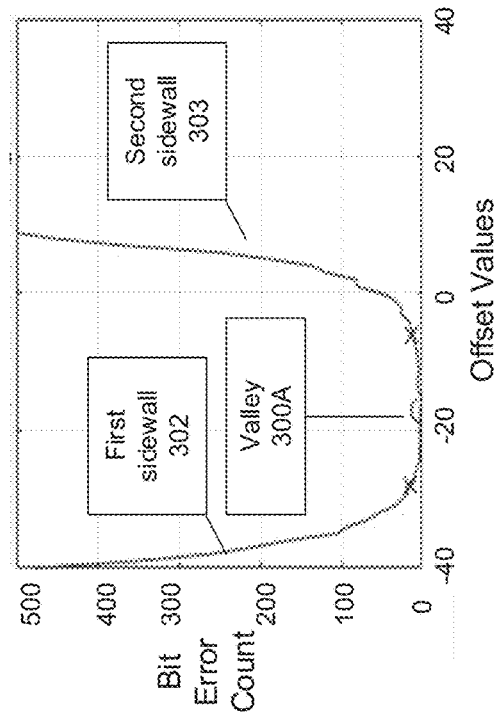

READ SAMPLE OFFSET PLACEMENT

TECHNICAL FIELD

Embodiments of the disclosure relate generally to memory sub-systems, and more specifically, relate to read sample offset strobe placement in a memory sub-system.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIGS. 3A-3C illustrate different valley shapes, in accordance with some embodiments of the present disclosure.

DETAILED DESCRIPTION

Figure 1:
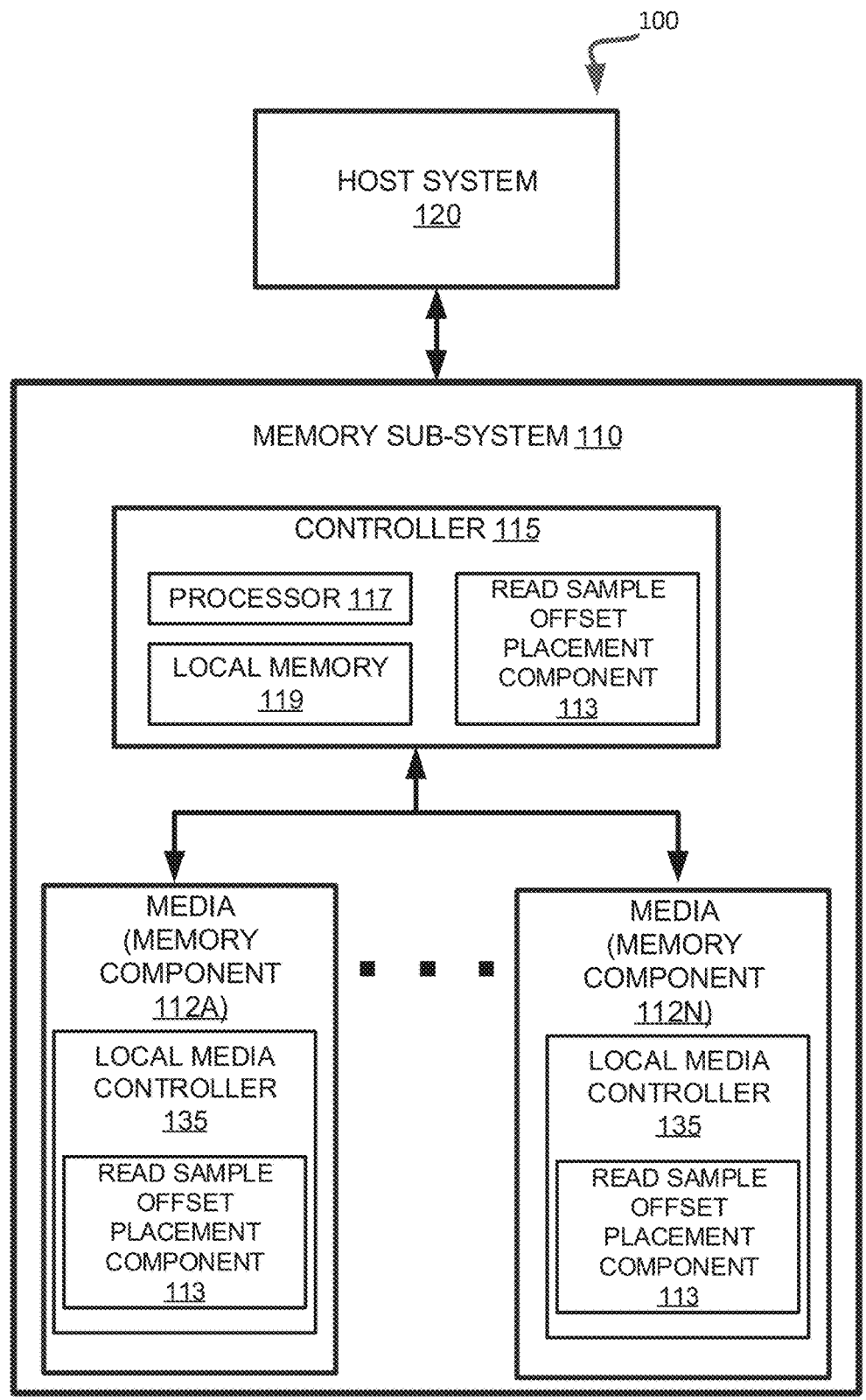
FIG. 1 illustrates an example computing environment that includes a memory sub-system in accordance with some embodiments of the present disclosure.

Aspects of the present disclosure are directed to adjusting placement of the sample or strobes of a read sample offset operation in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system in accordance with multiple programming distributions. A continuous read level calibration (cRLC) operation continuously samples margins between programming distributions, also referred to as read threshold valleys.

Conventional memory sub-systems can perform the cRLC calibration using a read sample offset (RSO) operation in which multiple reads are performed at varying offsets, generally referred to as left, right, and center samples or strobes, to read the data of the memory sub-system. Each of these reads is of the same data and each returns an error count associated with the data. Placement of the RSO strobes relative to the valleys of the programming distributions can impact the quality of the sampling. Conventionally, the left and right strobes are placed at fixed equidistance offsets relative to the center strobe (e.g., the respective distances between the left strobe and the center strobe and the right strobe and the center strobe are equal), without consideration of the shape of the valley. However, the shape of the valley can affect the optimal placement of the RSO strobes and can produce an undesirable error count. For example, the shape of the valley can result in a placement of a center strobe of an RSO operation being placed on a sidewall of a distribution, and not in a read threshold valley.

Aspects of the present disclosure address the above and other deficiencies by controlling the RSO sampling to adaptively place the RSO strobes to reduce the bit error count (BEC) or error count (EC) for the center strobe. In an embodiment, the RSO strobe placement is controlled in view of the corresponding shape of a read threshold valley. In an embodiment, for a read threshold valley having a single sidewall of a corresponding or adjacent programming distribution, a bias (e.g., an EC bias) can be added to one of the left offset strobe or the right offset strobe. In this embodiment, the EC bias is added to the side sample opposite or away from the wall of the half bathtub (e.g., the left offset strobe of the example half bathtub shape shown in FIG. 3A).

The memory sub-system can execute symmetric RSO sampling (e.g., where the left strobe and the right strobe are placed at an approximately equal distance from the center strobe) or asymmetric RSO sampling (e.g., where the left strobe and the right strobe are placed at different distances from the center strobe) during the RSO sampling operation. In an embodiment, the memory sub-system can switch, change or adjust between symmetric RSO sampling and asymmetric RSO sampling in view of a location of center EC strobe relative to the read threshold valley. Advantageously, controlling the placement of the strobes of a RSO operation according to embodiments of present disclosure produces a reduced BEC for the center strobe (e.g., improved cRLC placement) and reduces a likelihood of an uncorrectable error correction code (UECC) during cRLC and memory sub-system operation.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120. As described herein, in one embodiment, the memory components 112A to 112N include local media controllers 135. For example, the memory components 112A to 112N are NAND memory devices and include NAND controllers. The local media controllers 135 can include a RSO placement component 113. In some embodiments, a local media controller 135 (e.g., NAND controller) can perform the multiple read sample offset strobes on the one or more memory components 112A to 112N.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a RSO placement component 113 that can identify a valley type and monitor DiffEC values to execute adjustments to the RSO sampling operation. In some embodiments, the controller 115 includes at least a portion of the RSO placement component 113. For example, the controller 115 can include a processor 117 (processing device) configured to execute instructions stored in local memory 119 for performing the operations described herein. Alternatively, the controller 115 includes circuits to implement the operations described herein. In some embodiments, the host system 120 can include a portion of the RSO placement component 113. For example, the controller 115 can include a processor 117 (processing device) configured to execute instructions stored in local memory 119 for performing the operations described herein. In some embodiments, the RSO placement component 113 is part of the host system 110, an application, or an operating system.

The RSO placement component 113 can perform a first read of data from the memory components 112A to 112N using a first center value corresponding to a first read level threshold, a second read of the same data using a negative offset value that is lower than the center value, and a third read of the same data using a positive offset value that is higher than the center value. The RSO placement component 113 can apply or execute symmetric RSO sampling (e.g., where the left strobe and the right strobe are placed an equal distance from the center strobe) or asymmetric RSO sampling (e.g., where the left strobe and the right strobe are placed at different distances from the center strobe) during the RSO sampling operation.

The valley margin can refer to a relative width (also referred to as "margin" herein) between pairs of adjacent programming distributions. For example, valley margins associated with a particular logical page type can indicate the relative width between pairs of programming distributions associated with the particular logical page type. For instance, a first valley margin of an upper logical page (e.g., valley 2 that is between the 2nd distribution (L1) and 3rd distribution (L2)) that is larger than a second valley margin of the upper logical page (e.g., valley 6 that is between the 6th distribution (L5) and the 7th distribution (L6)) can indicate that the first valley is larger than the second valley (e.g., valley 2 is larger than valley 3), but does not explicitly recite the absolute width or size of either valley.

The cRLC operation is a read level calibration that can be done for each of the multiple read level threshold registers used during all read operations. A read level threshold register can store a value that indicates the read level threshold voltage for a particular valley. The cRLC operation can be performed to keep each read level threshold centered so that the memory component can achieve a best or lowest overall bit error count (BER) (also referred to as error count (EC)). The cRLC operation is referred to as continuous because the operation samples continually and dynamically at discrete intervals. For example, a sample, which can be a set of three reads (e.g., reads of a RSO operation), can be made at about 1 sample operation in every 1 to 30 seconds, depending on the requirements. Each sample initiated by the cRLC operation returns data for a particular die and a particular logical page type so that over many of these operations the information is aggregated and fed back in a closed loop system such that each die or read level threshold is kept calibrated (e.g., the read level threshold is centered).

In one implementation, a sample is three reads from the same read threshold valley (e.g., also referred to as a "valley" or "Vt distribution valley" herein). The read level thresholds of the memory component can start with manufacturing default read level thresholds. The cRLC operation can be run during a test mode so that all read level offset trims of all word line groups (WLGs) of all dies in the memory system are calibrated (also referred to as "converged" herein). A memory cell (or WLG or memory component, etc.) that is calibrated or converged by cRLC has a center value that corresponds to a read level threshold (or read level trim) that is centered in or at a lowest point in the read threshold valley. A memory cell (or WLG or memory component, etc.) that is calibrated or converged by cRLC has a center value that results in a lowest bit error rate (BER). BER can refer to a ratio of a number of bits in error of a data vector divided by a total number of bits for the given data vector. BER can correspond to a particular logical page type. For example, a particular logical page type has a particular BER and another logical page type has another BER. A trim can refer to digital value that is used for a circuit, such as a register, that is converted into an analog voltage value. For example, the read level threshold trims can be programmed into a trim register, which produces a read level threshold voltage used to read data from a memory cell.

Valleys can have different shapes (e.g., shape types or classifications) based on the corresponding programming distributions. For example, a valley can have a shape defined by a single sidewall formed by a programming distribution (herein referred to as a "half bathtub shape" or a "first shape"). In an embodiment, the shape can be defined as a graph or plot of a BER value as it changes relative to different read threshold voltages (or offset values). An example valley having a half bathtub shape is shown in FIG. 3A. In another example, a valley can have a shape defined by two sidewalls corresponding to a pair of adjacent programming distributions (herein referred to as a "full bathtub shape" or "second shape"). An example valley having a full bathtub shape is shown in FIG. 3B. In another example, a valley can be defined by two sidewalls corresponding to a pair of programming distributions where multiple cRLC samples result in a transition from a half bathtub shape to a different shape where one of the sidewalls moves up and converges or closes in on the opposing sidewall (herein referred to as a "combination bathtub shape"). An example valley having a combination bathtub shape is shown in FIG. 3C. A combination bathtub shape is caused from asymmetric distributions where the slope of the left sidewall is different than the slope of the right sidewall.

In an embodiment, in executing a RSO sampling operation for a valley having a half bathtub shape, the RSO placement component 113 can add an EC bias to one of the RSO offset side samples. In an embodiment, the RSO placement component 113 can monitor the results of the RSO sampling operation to identify an instance of sidewall sampling and, in response, switch a next RSO sampling operation from asymmetric RSO sampling to symmetric RSO sampling to place a center EC strobe in a preferred location (i.e., at or near a valley). In one embodiment, the RSO placement component 113 includes a logic circuit to perform the RSO placement operations as described herein.

In an embodiment, for a valley having a half bathtub shape, a bias (e.g., an EC bias) can be added to one of the left offset strobe or the right offset strobe. In this embodiment, the EC bias is added to the side sample opposite or away from the wall of the half bathtub (e.g., the left offset strobe of the example half bathtub shape shown in FIG. 3A).

The RSO placement component 113 can execute symmetric RSO sampling (e.g., where the left strobe and the right strobe are placed at an approximately equal distance from the center strobe) or asymmetric RSO sampling (e.g., where the left strobe and the right strobe are placed at different distances from the center strobe) during the RSO sampling operation. The RSO placement component 113 can use the multiple RSO samples to monitor a difference error count (DiffEC) composed of two components: a DiffEC of the left sidewall ($DiffEC_{LSW}$) and a DiffEC of the right sidewall ($DiffEC_{RSW}$), as described in greater detail below with reference to FIGS. 7A and 7B. In an embodiment, the DiffEC is equal to a sum of the $DiffEC_{LSW}$ and the $DiffEC_{RSW}$. If the total DiffEC resulting from an asymmetric sampling operation is a negative value, it is determined that the center strobe is placed on a sidewall of a programming distribution (also referred to "sidewall sampling"). Since placement of the center strobe on a sidewall results in a higher BEC, in a subsequent RSO operation, the asymmetric sampling can be switched to symmetric sampling to place the center EC strobe in a location at or near the valley (e.g., to avoid placement of the center EC strobe on a sidewall). Advantageously, controlling the placement of the strobes of a RSO operation according to embodiments of present disclosure produces a reduced BEC for the center strobe (e.g., improved cRLC placement) and reduces a likelihood of an uncorrectable error correction code (UECC) during cRLC and memory sub-system operation.

Figure 2:
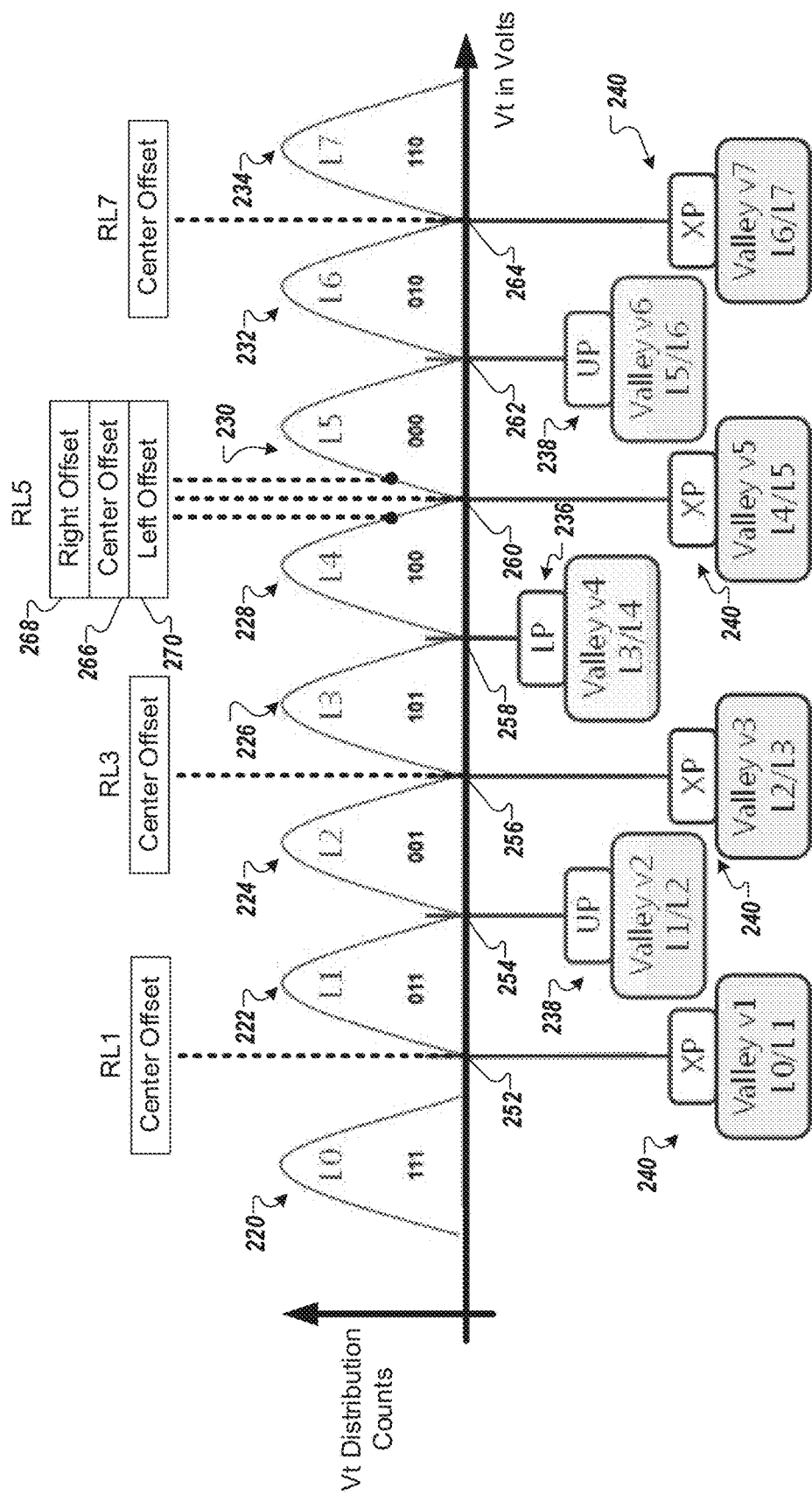
FIG. 2 illustrates a read sample offset for a read level threshold between two programming distributions of a memory cell with eight programming distributions, in accordance with some embodiments of the present disclosure.

FIG. 2 illustrates an example read sample offset operation for a read level threshold between two programming distributions of a TLC memory cell with eight programming distributions, in accordance with some embodiments of the present disclosure. A memory block with TLC memory cells stores TLC information using 3 bits of data per cell. As illustrated in FIG. 2, this is accomplished using eight programming distributions 220-234. A lower page (LP) is defined with one read level threshold 236. An upper page (UP) is defined with two read level thresholds 238. An extra page (XP) is defined with fourth read level thresholds 240. The eight programming distributions 220-234 each correspond to a level (L0:L7), each level corresponding to a code (000b:111b). Between each pair of eight programming distributions is a valley, totaling seven valleys (v1:v7). A center of each programming distribution 220-234 corresponds to a PV target for the respective programming distribution 220-232. In total, there can be seven PV targets (L1-L7) and seven read level thresholds 252-264. In addition, between pairs of adjacent programming distributions there is a relative width (also referred to as "valley margin" or "margin" herein). For example, valley margins associated with a particular logical page type can indicate the relative width between pairs of programming distributions associated with the particular logical page type. For instance, a first valley margin of an upper logical page (e.g., valley 2 that is between the $2^{nd}$ distribution (L1) and $3^{rd}$ distribution (L2)) that is larger than a second valley margin of the upper logical page (e.g., valley 6 that is between the sixth distribution (L5) and the seventh distribution (L6)) can indicate that the first valley is larger than the second valley (e.g., valley 2 is larger than valley 3), but does not explicitly recite the absolute width or size of either valley.

As illustrated in FIG. 2, execution of a RSO operation can include a first read operation using a center offset value 266 to obtain a center offset sample, a second read operation using a right offset value 268, and a third read operation using a left offset value 270. FIG. 2 illustrates multiple different valley shapes or configurations that can vary as a function of the stack type (e.g., SLC, MLC, TLC and QLC). In an embodiment, a valley can have two sidewalls (e.g., a full bathtub shape), as shown in FIG. 3B. In the example shown in FIG. 2, valley v5 has a full bathtub shape defined by a first sidewall of the L4 PV target and a second sidewall of the L5 PV target. As illustrated, the RSO sampling operation of valley v5 includes the left offset strobe 270 and the right offset strobe 268 that are substantially equidistant from the center offset strobe 266. With reference to FIG. 2, valleys v2-v7 represent example full bathtub valley shapes. In an embodiment, a valley can have a single sidewall (e.g., a half bathtub shape), as shown in FIG. 3A. With reference to FIG. 2, valley v1 has a half bathtub shape including a single sidewall corresponding to the L1 PV target.

In the embodiment depicted in FIG. 2, each PV target can be set in a default state as defined by factory settings. In some cases, all PV targets are adjusted, but in other embodiments, the first PV target and the last PV target can be fixed, allowing the intervening PV targets to be adjusted. For example, with seven PV targets (L1-L7), the L1 and L7 PV targets are fixed and the other PV targets L2 through L6 can receive characterized starting values, leading to faster cRLC and DPT algorithm conversion. Alternatively, the L1, and L7 PV targets are fixed and the other PV targets L2-L6 can be adjusted. These factory settings of the PV targets and read thresholds may produce undesirable BER results before cRLC and dynamic program targeting (DPT) operations. It should be noted that in some cases, the first programming distribution 220, corresponding to the first level L0, has a fixed PV target. Similarly, the eighth programming distribution 234, corresponding to the eighth level L7, can have a fixed PV target. Using a dynamic program targeting (DPT) operations, the PV targets of the intervening programming distributions, corresponding to levels L1-L6, can be adjusted.

In an embodiment, placement of the strobes of an RSO sampling operation can be optimized in view of the shape of the valley. For example, it is desirable to place a center EC strobe optimally placed center of the valley with the left EC strobe and the right EC strobe an equal distance from the center EC strobe. As noted above, valleys can have different shapes that affect optimal placement of the RSO sampling strobes. FIG. 3A illustrates an example of a valley 300A having half bathtub shape including a single sidewall 301. FIG. 3B illustrates an example of a valley 300B having full bathtub shape including a first sidewall 302 and a second sidewall 303. In an embodiment, multiple cRLC calibration samples can result in a transition from a half bathtub shape into a combination bathtub shape, where one of the sidewalls moves up and converges or closes in on the opposing sidewall. FIG. 3C illustrates an example of a valley 300C having combination bathtub shape including a first sidewall 304 converging toward and a second sidewall 305.

Figure 4:
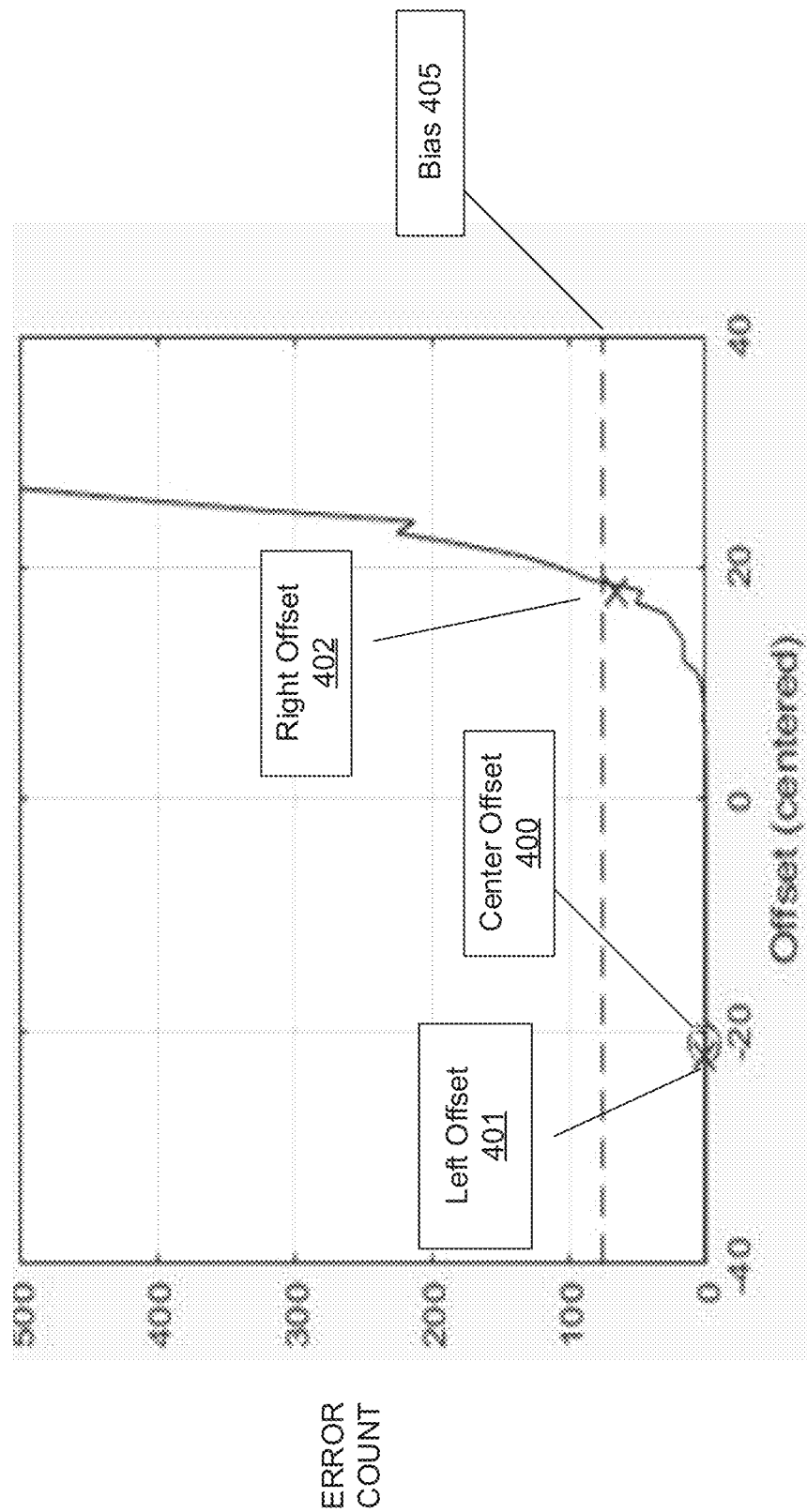
FIG. 4 illustrates an application of error count biasing in an example read sample offset operation, in accordance with some embodiments of the present disclosure.

FIG. 4 illustrates an example RSO sampling including a bias (e.g., an EC bias), according to an embodiment of the present disclosure. A valley having a half bathtub shape can include a relatively large portion which is flat (e.g., the valley in FIG. 4 has a relatively flat portion that extends from an offset value of approximately 10 to an offset value of approximately −40. Due to the large flat portion of the valley, the center EC strobe may not be placed at a center of the valley, resulting in a left EC strobe and a right EC strobe that are not balanced or approximately equal. To account for the relatively flat and extended valley with a half bathtub shape, a bias of error counts is added to one of the side samples (e.g., the left EC sample or the right EC sample). In the example shown in FIG. 4, since the left offset 401 produces a zero error count value, a bias is added to the left offset 401 EC to add an error count to balance the error count of the right sample. Adding the bias 405 to the left offset sample forces the right offset sample to servo or be controlled around a bias 405 at the same level. In the example shown in FIG. 4, an EC bias of 75 ECs is added the left offset sample, causing the right offset sample 402 to be controlled around the same level as the bias, or an error count value of 75. Introducing or adding the bias 405 to one of the right or left samples results in a balancing of the ECs for the side samples. In an embodiment, the cRLC dithers with the right offset sample controlled around the bias level (e.g., 75 ECs) on the right sidewall when the trim is centered.

Figure 5:
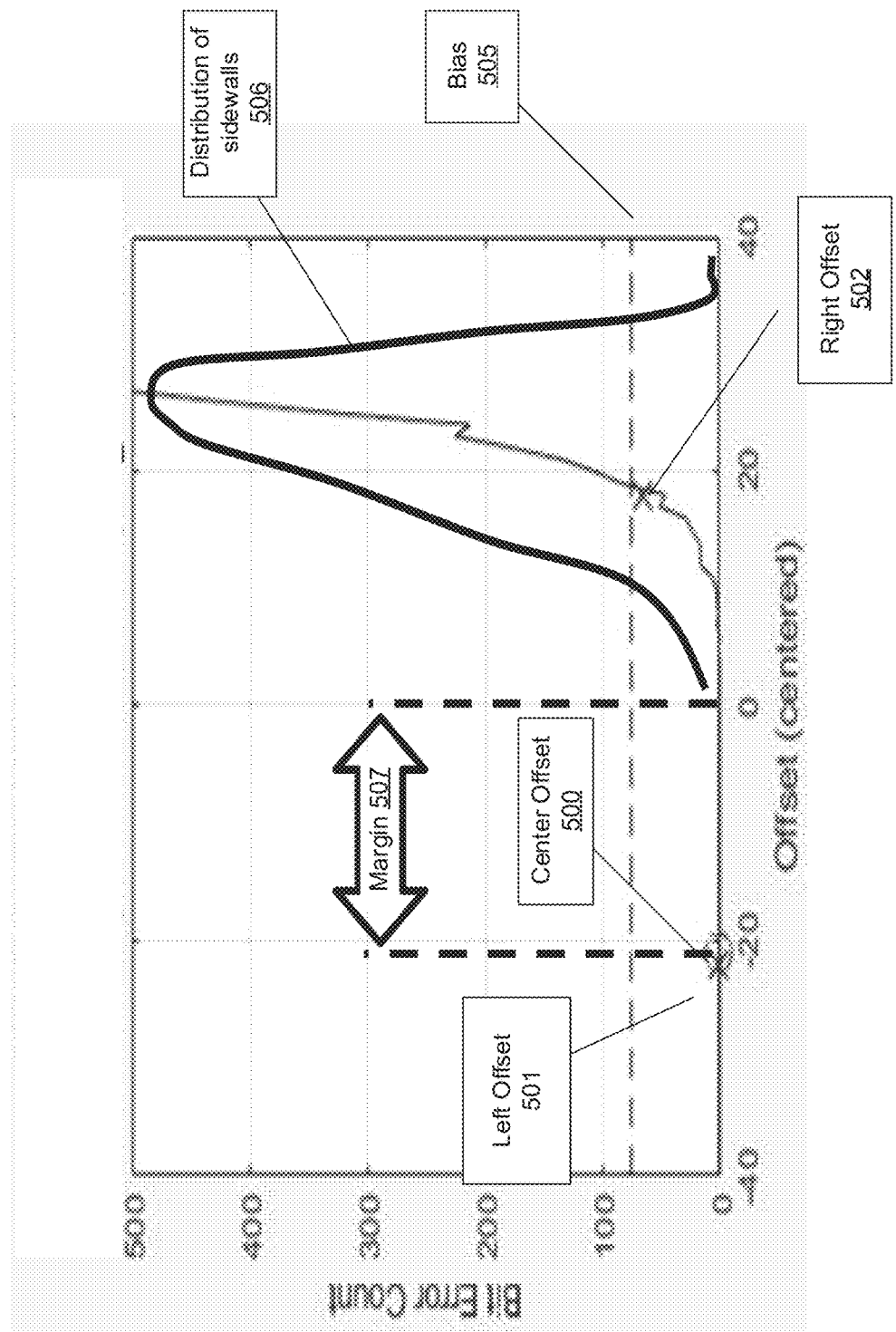
FIG. 5 is a graph illustrating an example asymmetric read sample offset operation with error count biasing, in accordance with some embodiments of the present disclosure.

FIG. 5 illustrates an example asymmetric RSO sampling of a valley having a half bathtub shape, according to embodiments of the present disclosure. As multiple RSO sampling operations are performed on multiple different memory blocks, a location of the sidewall can move as the reading is moved from block to block. An aggregation of multiple RSO sampling operations of different blocks generate a distribution of sidewalls 506. In an example, the distribution of sidewalls 506 represents an overlaying of multiple sidewalls resulting from the multiple reads of the different memory blocks over a period of time. To control or select a location of the sidewall among the distribution of sidewalls, asymmetric sampling can be applied to add a margin value 507 to the center sample to move the center sample 500 away from the sidewall (e.g., adding a margin 507 to the center sample 500 to move it from a zero value which is disadvantageously close to the distribution of sidewalls 506). In this example, the margin 507 has an absolute value of approximately 19 and the center sample 500 is moved from an offset value of zero to an offset value of approximately −19. As shown, the asymmetric sampling including a margin 507 of approximately 19 moves the center offset 500 to an offset of −19, which is away from the distribution of sidewalls 506.

In an embodiment, a value of the margin 507 can be an offset value away from the distribution of sidewalls that does not exceed an absolute value of the opposing side sample. For example, the margin in FIG. 5 is set to a value of approximately 19 since the left offset 501 has a value of −20. In this example, the margin is set to a value such that the center offset 500 is not set to a value that passes the left offset 501. In this example, the margin value can have an absolute value in a range of approximately 1 to 19, since the left offset has an absolute value of 20. This advantageously places the center offset 500 at a maximum distance or position away from the distribution of sidewalls 506 while not being placed to the left of the left offset 501.

In addition, since the valley has a half bathtub shape, bias 505 can be set by adding a bias EC to the left offset 501 to control the right offset at a level corresponding to the bias and placed on the right sidewall of the valley. Accordingly, FIG. 5 illustrates an example RSO operation executed using a combination of RSO sample placement techniques including asymmetric RSO sampling with a bias, according to embodiments of the present disclosure.

Figure 6:
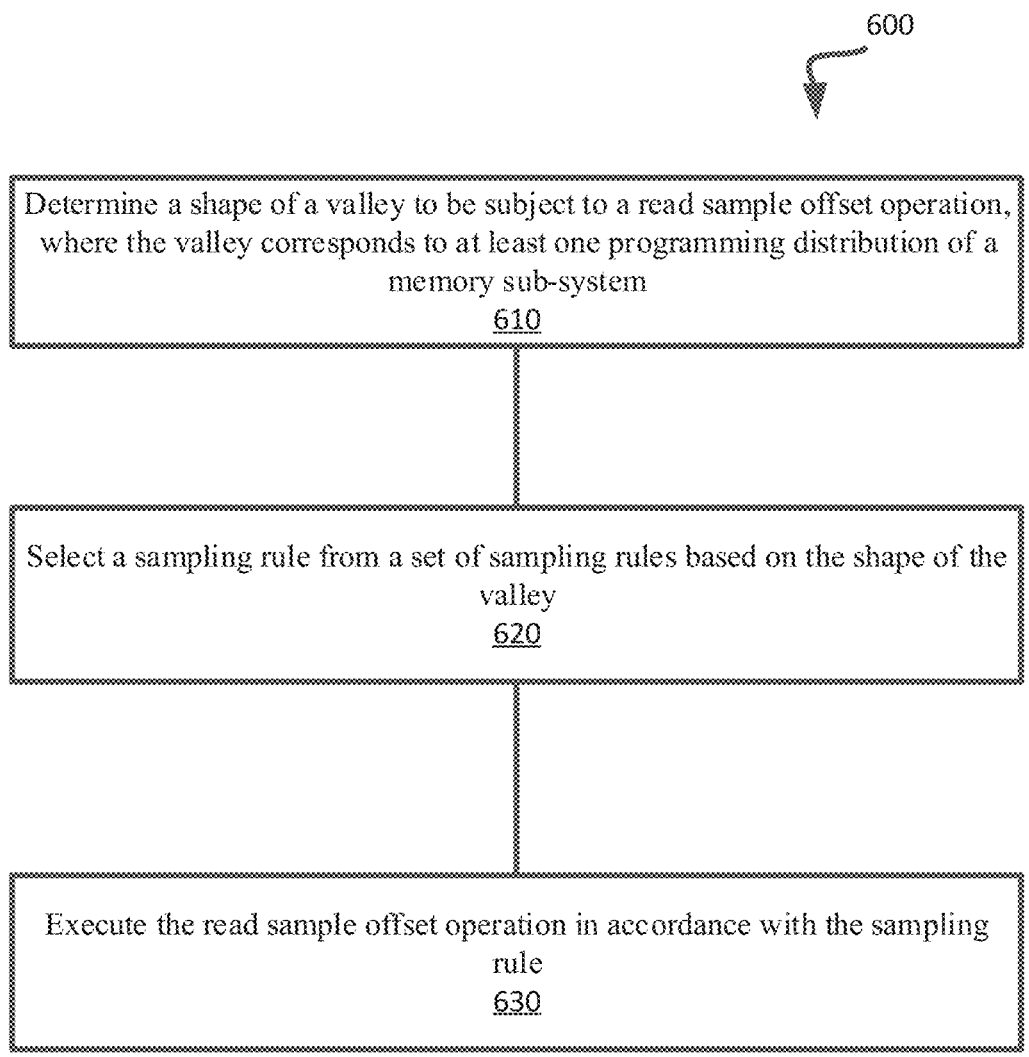
FIG. 6 is a flow diagram of an example method to execute a read sample offset operation in accordance with some embodiments of the present disclosure.

FIG. 6 is a flow diagram of an example method 600 to control strobe placement in an RSO sampling operation, according to embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the RSO placement component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic determines a shape of a valley to be subject to a read sample offset operation, wherein the valley corresponds to at least one programming distribution of a memory sub-system. In an embodiment, the valley shape can be one of a half bathtub shape (e.g., as shown in FIG. 3A), a full bathtub shape (e.g., as shown in FIG. 3B), or a combination bathtub shape (e.g., as shown in FIG. 3C). In an embodiment, the left sidewall portion and right sidewall portion (e.g., the left sidewall and right sidewall vectors) are used for determining valley shape. In an embodiment, when the left sidewall and the right sidewall satisfy a first condition (e.g., a difference error count of the leftside wall is substantially equal to a difference error count of the rightside wall, as described in greater detail below), the valley has a normal or full bathtub shape. In an embodiment, when a difference between the left sidewall and the right sidewall satisfies a second condition (e.g., a difference between a difference error count of the leftside wall and a difference error count of the rightside wall is greater than a first threshold amount, as described in greater detail below), it is determined that the valley transitioned to a combination shape. In an embodiment, when a difference between the left sidewall and the right sidewall satisfies a third condition (e.g., a difference between a difference error count of the leftside wall and a difference error count of the rightside wall is greater than a second threshold amount, where the second threshold amount is greater than the first threshold amount, as described in greater detail below), the valley is determined to have a half bathtub shape.

For example, for valley v1 of FIG. 2, the processing logic determines valley v1 has a half bathtub shape (e.g., has a single sidewall). In another example, for valley v5 of FIG. 2, the processing logic determines valley v5 has a full bathtub shape (e.g., has a two sidewalls). In an embodiment, the processing logic determines a valley has a combination bathtub shape if multiple cRLC samples result in a transition from a half bathtub shape to a different shape where one of the sidewalls moves up and converges or closes in on the opposing sidewall.

In an embodiment, to determine the shape of the valley, the processing device calculates a difference error count (DiffEC) based on one or more previous cRLC calibration operations. An example method for calculating the DiffEC is described in detail below with reference to the examples shown in FIGS. 7A and 7B.

Figure 7B:
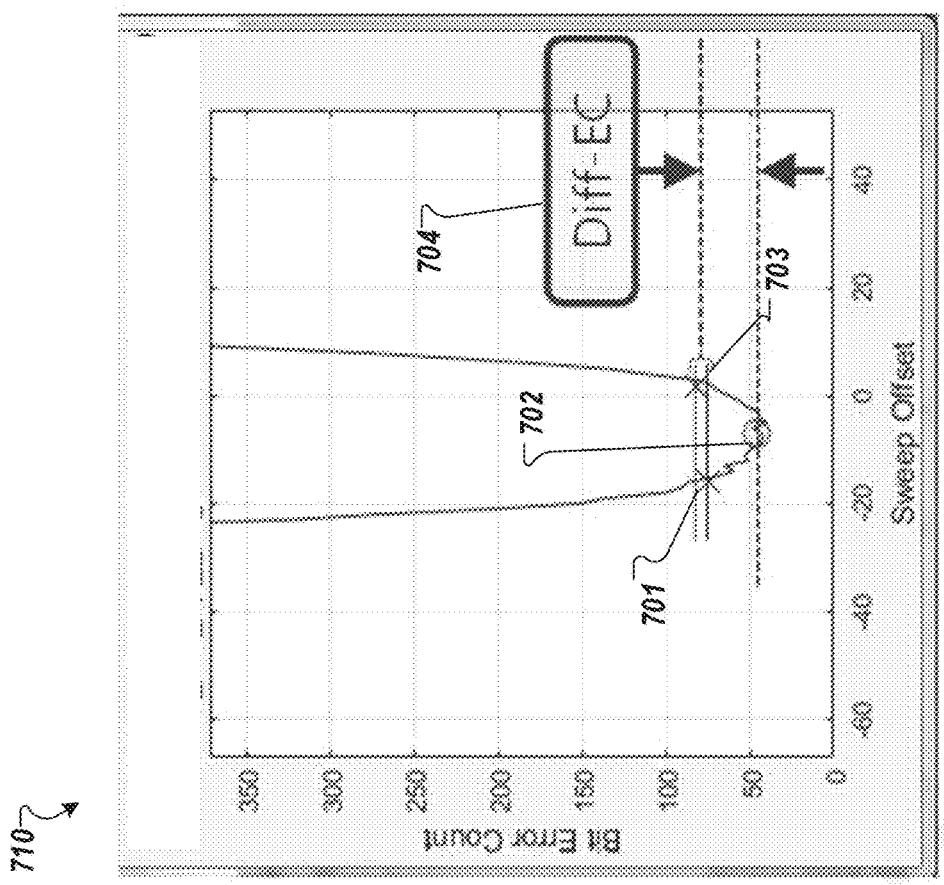
FIGS. 7A and 7B are graphs illustrating a read sample offset sweep for comparing error counts and difference bit counts, in accordance with some embodiments of the present disclosure.
Figure 7A:
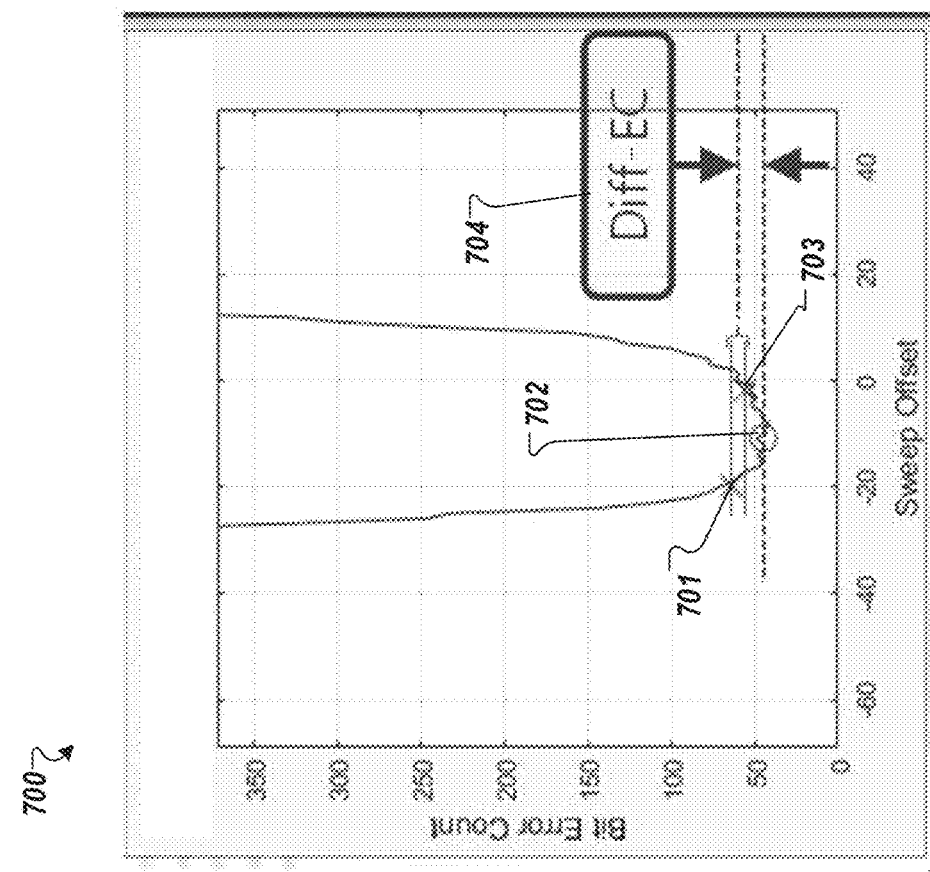

FIGS. 7A-7B illustrate DiffECs of two read level thresholds between two programming distributions in accordance with some memory sub-systems. In an embodiment, each time a valley trim is sampled as part of the cRLC algorithm, a DiffEC 704 can be determined. Each sample includes a left sample 701, a center sample 702, and a right sample 703, where the DiffEC 704 is a relative width of the valley. The cRLC algorithm centers or calibrates, by balancing the side samples (left sample 701 and right sample 703). FIG. 7A illustrates a valley between two programming distributions of a memory cell and FIG. 7B illustrates a valley between two other programming distributions of the memory cell. FIGS. 7A-7B are examples of calibrated valleys with the center samples 702 being balanced between the side samples. FIG. 7A demonstrates wide valley behavior 700 and FIG. 7B demonstrates narrow valley behavior 710.

In an embodiment, to determine the valley depths of a programming distribution, the cRLC algorithm can determine the DiffEC measurement 704. The DiffEC measurement 704 can be used to identify the valley depth or Read Window Budget (RWB). The DiffEC measurement 704 can be the mean of the two side samples 701, 703 minus the center value 702. So, the DPT algorithm can perform BER leveling by moving PV targets to match not only the error counts between page types, but also match the RWB by valley within each page type. In an embodiment, the valley depth (i.e., or RWB) can be different even within these multi valley page types (UP & XP).

In an embodiment, the DiffEC 704 is determined based on the error counts associated with the read samples (e.g., the Left Error Count (LeftEC), the Right Error Count (RightEC), and the Center Error Count (CenterEC) as represented by the following expression:

$$DiffEC = \frac{\text{Left Error Count} + \text{Right Error Count}}{2} - \text{Center Error Count}$$

As illustrated, the example of FIG. 7A has a lower DiffEC measurement 704 than the example of FIG. 7B, such that the example shown in FIG. 7A has a narrower valley as compared to the example shown in FIG. 7B. The DiffEC value equals the sum of the DiffEC of the left sidewall (DiffEC$_{LSW}$) and the DiffEC of the right sidewall (DiffEC$_{RSW}$). In an embodiment, based on the DiffEC value 704, the DiffEC$_{LSW}$ and the DiffEC$_{RSW}$ are determined according to the following expressions:

$$DiffEC_{lsw} = \frac{RightEC - CenterEC}{2}; \text{ and}$$

$$DiffEC_{rsw} = \frac{LeftEC - CenterEC}{2}$$

In an embodiment, DiffEC$_{LSW}$ provides an indication of how the left offset strobe is positioned in a valley relative to the right offset strobe. In an embodiment, DiffEC$_{RSW}$ provides an indication of how the right offset strobe is positioned in a valley relative to the left offset strobe.

With reference to FIG. 6, in operation 210, the processing device can determine the valley has a full bathtub shape if symmetric sampling is applied and DiffEC$_{LSW}$ is equal or substantially equal to DiffEC$_{RSW}$. In an embodiment, for a valley having a half bathtub shape, artificial bias can be subtracted out before computing the DiffEC value. In this embodiment, the DiffEC value represents the wide valley characteristic of a half bathtub shape. As the shape of the valley changes from a half bathtub shape to a combination shape or full bathtub shape, the DiffEC computation reflects the valley width characteristics. In an embodiment, if a first condition is satisfied where the DiffEC$_{LSW}$ is equal or substantially equal to DiffEC$_{RSW}$, the valley is determined to have a normal or full bathtub shape. In an embodiment, the full bathtub shape can be characterized by a valley with two sidewalls (a left sidewall and a right sidewall) having equal or substantially equal DiffEC values.

In an embodiment, if a second condition is satisfied where the DiffEC$_{LSW}$ and DiffEC$_{RSW}$ values differ by more than a first threshold amount, the valley is determined to have a combination shape (or combination bathtub shape). In an embodiment, the combination shape can be characterized by a valley having two sidewalls with different DiffEC values. In an embodiment, if a third condition is satisfied where DiffEC$_{LSW}$ and DiffEC$_{RSW}$ values differ by more than a second threshold amount (where the second threshold amount is greater than the first threshold amount), the valley is determined to have a half bathtub shape. In an embodiment, the half bathtub shape can be characterized by a valley having a single sidewall.

In an embodiment, when the left sidewall and the right sidewall satisfy a first condition (e.g., a difference error count of the leftside wall is substantially equal to a difference error count of the rightside wall, as described in greater detail below), the valley has a normal or full bathtub shape. In an embodiment, when a difference between the left sidewall and the right sidewall satisfies a second condition (e.g., a difference between a difference error count of the leftside wall and a difference error count of the rightside wall is greater than a first threshold amount, as described in greater detail below), it is determined that the valley transitioned to a combination shape. In an embodiment, when a difference between the left sidewall and the right sidewall satisfies a third condition (e.g., a difference between a difference error count of the leftside wall and a difference error count of the rightside wall is greater than a second threshold amount, where the second threshold amount is greater than the first threshold amount, as described in greater detail below), the valley is determined to have a half bathtub shape.

In operation 620, the processing logic selects a sampling rule from a set of sampling rules based on the shape of the valley. In an embodiment, the set of sampling rules can include rules relating to the application of asymmetric RSO sampling, symmetric RSO sampling, and error count biasing. In an embodiment, for a valley having a half bathtub shape, the processing logic can select a sampling rule corresponding to application of asymmetric RSO sampling with EC bias (as shown in FIG. 5). In an embodiment, for a valley having a full bathtub shape, the processing logic can select a sampling rule corresponding to application of symmetric RSO sampling. In an embodiment, for a valley having a combination bathtub shape, the processing logic can select a sampling rule corresponding to application of symmetric RSO sampling with EC bias.

In operation 630, the processing logic executes the read sample offset operation in accordance with the sampling rule. In an embodiment, the sampling rule selected in operation 620 is applied to the RSO sampling operation to obtain EC readings corresponding to the valley. In an embodiment, selection of the RSO sampling rule (e.g., asymmetric sampling (with our without biasing) or symmetric sampling (with or without biasing)) results in improved strobe placement. Advantageously, selectively applying a sampling rule in view of the shape of the valley results in a lower center RSO EC.

Figure 8:
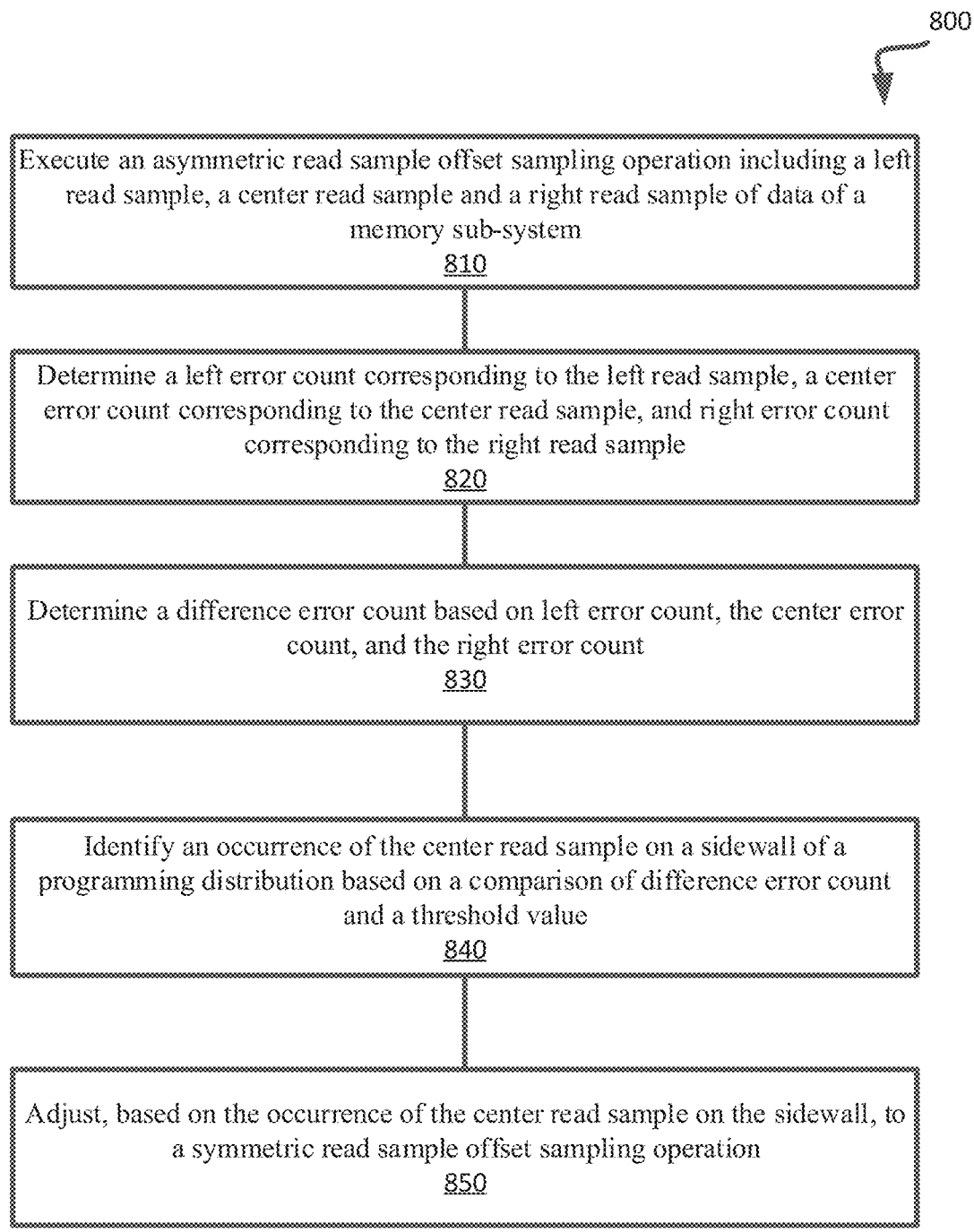
FIG. 8 is a flow diagram of an example method to perform a read sample offset operation, in accordance with some embodiments of the present disclosure.
Figure 9:
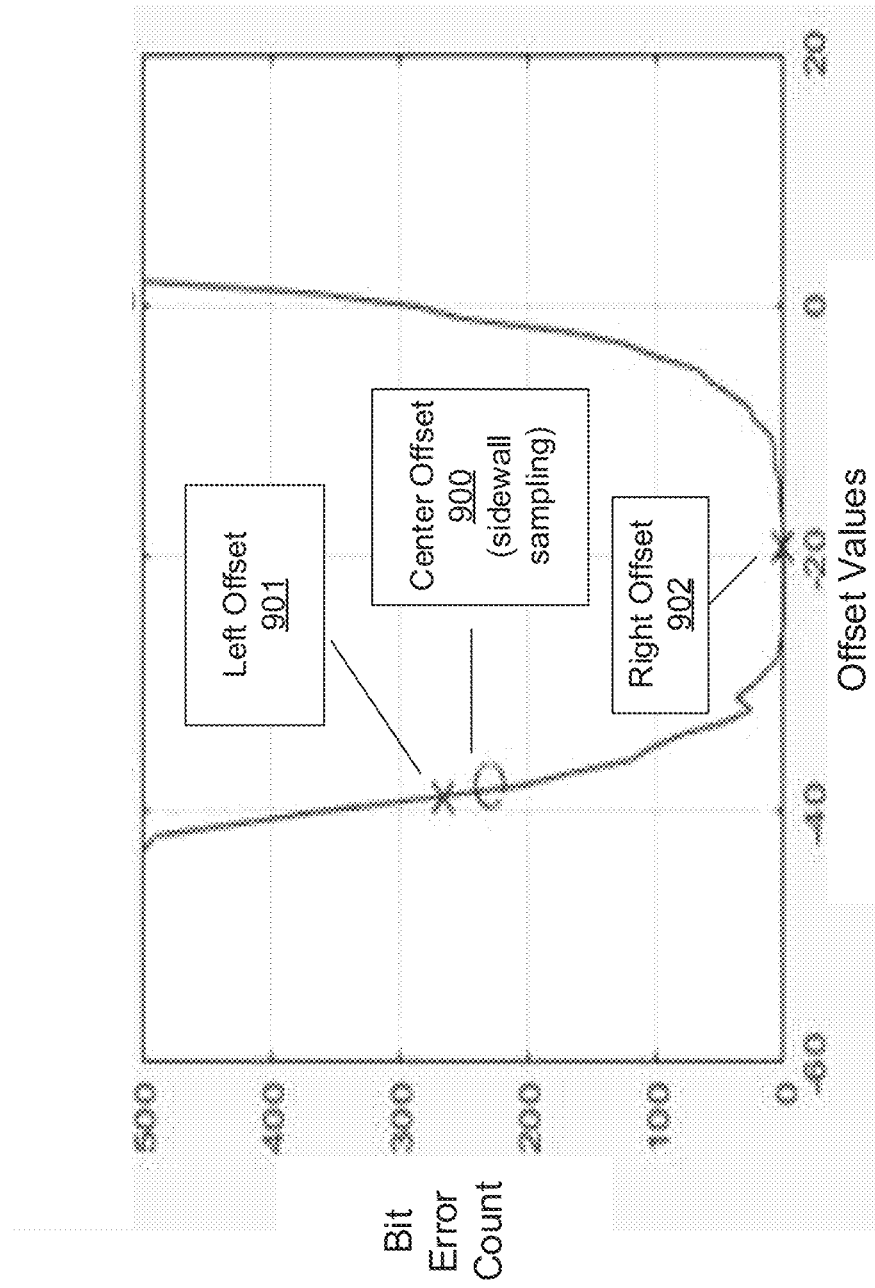
FIG. 9 is a graph illustrating an example of sidewall sampling in a symmetric read sample offset sampling, in accordance with some embodiments of the present disclosure.

FIG. 8 is a flow diagram of an example method 800 to manage strobe placement in an RSO sampling operation, according to embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the RSO placement component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing device executes an asymmetric RSO sampling operation including a left read sample, a center read sample and a right read sample of data of a memory sub-system. In an embodiment the asymmetric RSO sampling operation includes a left read sample and a right read sample that are different respective distances from the center read sample. For example, the center read sample can be moved by a margin value from a first offset position (e.g., a zero offset position) to a second offset position, such that the center read sample is closer to one of the side read samples (e.g., the left read sample) than it is to the other side read sample (e.g., the right read sample), as shown in the example illustrated in FIG. 5.

At operation 820, the processing device determines a left error count corresponding to the left read sample, a center error count corresponding to the center read sample, and right error count corresponding to the right read sample.

At operation 830, the processing device determine a difference error count (DiffEC) based on left error count, the center error count, and the right error count. In an embodiment, for a given sampling of a valley trim, the DiffEC is calculated based on the error counts corresponding to the left sample, the right sample, and the center sample. An example method for calculating the DiffEC is described in detail above with reference to the examples shown in FIGS. 7A and 7B.

At operation 840, the processing device identifies an occurrence of the center read sample on a sidewall of a programming distribution based on a determination that the difference error count satisfies a threshold condition. In an embodiment, the threshold condition is satisfied if the DiffEC value is less than an associated threshold value (e.g., zero). In an embodiment, the center read sample is identified as being on a sidewall if the DiffEC value is less than a threshold value (e.g., zero). In an embodiment, if the center error count is greater than either the left error count or the right error count, the DiffEC is a negative value (e.g., less than zero) and it is determined that the DiffEC value satisfies the threshold condition, indicating that sidewall sampling occurred (e.g., the center strobe was placed on a sidewall). FIG. 8 illustrates an example of an asymmetric RSO sampling operation including a center offset 800, a left offset 801 and a right offset 802. As shown in FIG. 8, the asymmetric sampling included moving the center offset 800 by a margin such that it is closer to the left offset 801 than it is to the right offset 800. However, as shown, the center offset 800 is placed on the left sidewall. The occurrence of the center read sample 800 on the sidewall is identified based on a comparison of the DiffEC to the threshold value. In the example shown, the DiffEC is determined to be a negative number (e.g., less than the threshold value of zero).

At operation 850, the processing device adjusts, based on the occurrence of the center read sample on the sidewall, to a symmetric read sample offset sampling operation. In an embodiment, the processing device monitors for the occurrence of a sidewall sampling in an asymmetric sampling operation and if identified, adjusts, switches, or changes to a symmetric sampling to place a center EC strobe at or near the valley (e.g., the valley of the full bathtub shape, as shown in FIG. 8) to achieve a lower RSO EC and better cRLC trim placement.

Figure 10:
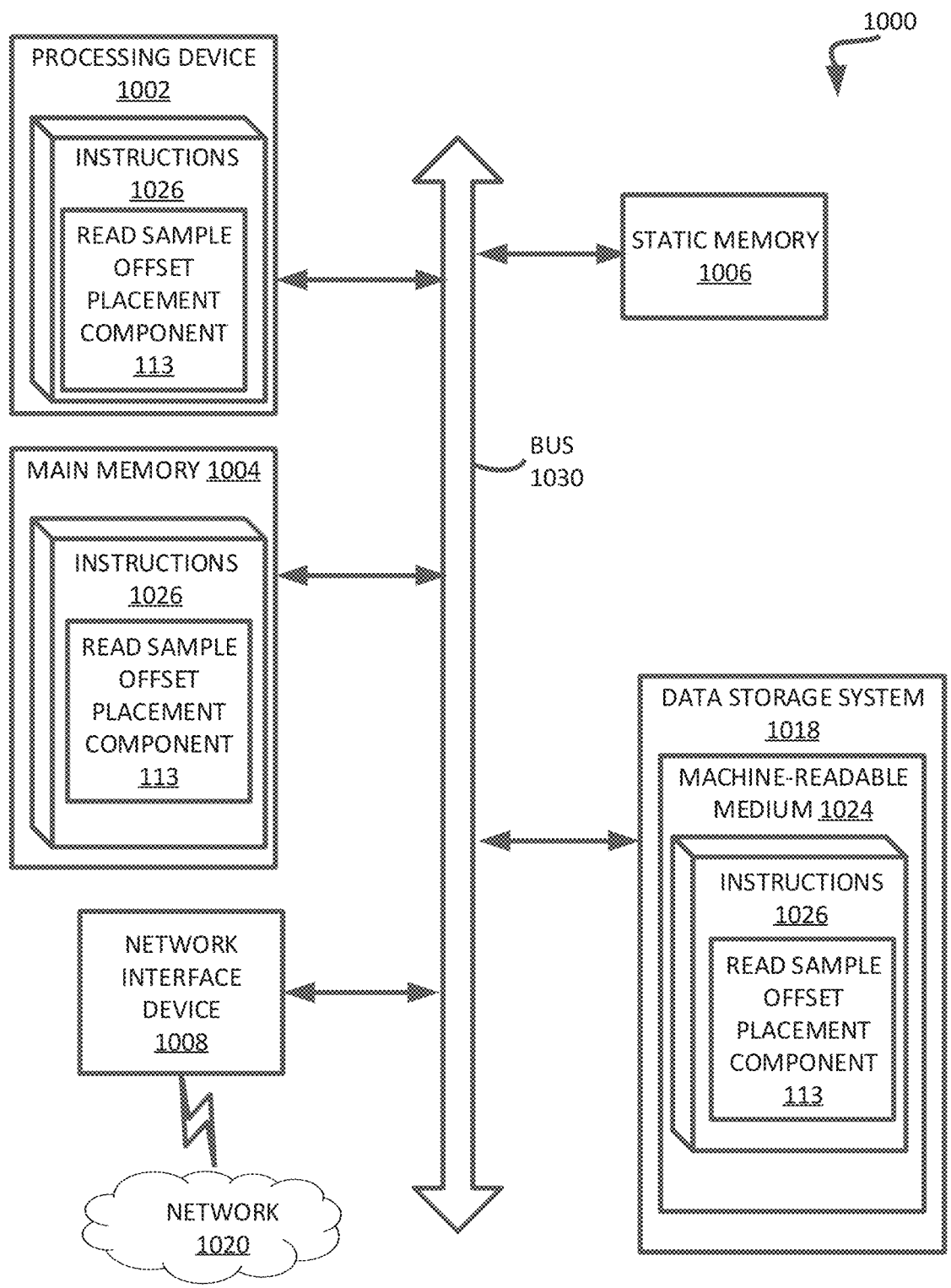
FIG. 10 is a block diagram of an example computer system in which embodiments of the present disclosure may operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the RSO placement component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1026 include instructions to implement functionality corresponding to a caching component (e.g., the RSO placement component 113 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
identifying a plurality of programming distributions of memory cells corresponding to respective programming levels of a plurality of programming levels of a memory sub-system;
identifying a valley corresponding to at least one programming distribution of the plurality of programming distributions, wherein the valley comprises a first portion corresponding to a sidewall of the at least one programming distribution and a second portion;
comparing a first error count associated with the first portion and a second error count associated with the second portion to generate a comparison result, wherein the comparison result comprises one of:
a first comparison result when the first error count is substantially equal to the second error count,
a second comparison result when a difference between the first error count and the second error count is greater than a first threshold level, or
a third comparison result when the difference between the first error count and the second error count is greater than a second threshold level;
selecting a sampling rule corresponding to the comparison result from a set of sampling rules; and executing a read sample offset operation comprising a plurality of strobes having voltage levels established in accordance with the sampling rule selected to calibrate the memory sub-system.

2. The method of claim 1, wherein the second portion comprises a second sidewall corresponding to a second programming distribution.

3. The method of claim 1, further comprising identifying a first sidewall on a first side of the valley and a second sidewall on a second side of the valley, wherein the sidewall of the first portion comprises the first sidewall and the second portion comprises the second sidewall.

4. The method of claim 3, wherein the sampling rule comprises a symmetric sampling comprising placing a center read sample of the read sample offset operation an equal distance between a left read sample and a right read sample.

5. The method of claim 1, wherein the sidewall of the first portion is a single sidewall on one side of the valley.

6. The method of claim 5, wherein the sampling rule comprises an asymmetric sampling comprising placing a center read sample of the read sample operation at a margin distance from a zero offset position.

7. The method of claim 6, wherein a first distance between the center read sample and a left read sample is less than a second distance between the center read sample and a right read sample.

8. The method of claim 1, further comprising adding a bias value of error counts to an error count corresponding to one of a left read sample or a right read sample of the read sample offset operation.

9. The method of claim 1, wherein the set of sampling rules comprises asymmetric sampling, asymmetric sampling with error count biasing, and symmetric sampling with error count biasing.

10. A system comprising:
a memory component; and
a processing device, operatively coupled with the memory component, the processing device to:
  execute an asymmetric read sample offset sampling operation comprising a left read sample, a center read sample and a right read sample of data of at least one programming distribution of memory cells of a plurality of programming distributions of a memory sub-system;
  determine a left error count corresponding to the left read sample, a center error count corresponding to the center read sample, and right error count corresponding to the right read sample;
  determine a difference error count based on left error count, the center error count, and the right error count satisfies a threshold condition;
  identify an occurrence of the center read sample on a sidewall of the at least one programming distribution based on a determination that the difference error count satisfies the threshold condition;
  in response to identifying the occurrence of the center read sample on the sidewall, select a sampling rule from a set of sampling rules; and
  execute, based on the sampling rule, a symmetric read sample offset sampling operation to calibrate the memory sub-system.

11. The system of claim 10, wherein the difference error count indicates a width of a valley corresponding to the at least one programming distribution.

12. The system of claim 10, wherein the threshold value is zero, and wherein the occurrence of the center read sample on the sidewall is identified in view of the difference error count having a value less than the threshold value.

13. The system of claim 10, the processing device further to execute the symmetric read sample offset sampling operation by placing a subsequent center read sample at an offset value location that is equidistant from a subsequent left read sample and a subsequent right read sample.

14. The system of claim 13, wherein a first margin between the subsequent center read sample and the subsequent left read sample equals a second margin between the subsequent center read sample and the subsequent right read sample.

15. The system of claim 10, the processing device further to:
add a bias value of error counts to the left error count of the asymmetric read sample offset sampling operation; and
execute the symmetric read sample offset sampling operation to produce a subsequent left error count that equals a subsequent right error count.

16. A method comprising:
executing, by a processing device, an asymmetric read sample offset sampling operation comprising a left read sample, a center read sample and a right read sample of data of at least one programming distribution of memory cells of a plurality of programming distributions of a memory sub-system;
determining a left error count corresponding to the left read sample, a center error count corresponding to the center read sample, and right error count corresponding to the right read sample;
determining a difference error count based on left error count, the center error count, and the right error count satisfies a threshold condition;
identifying an occurrence of the center read sample on a sidewall of the at least one programming distribution based on a determination that the difference error count satisfies the threshold condition;
in response to identifying the occurrence of the center read sample on the sidewall, selecting a sampling rule from a set of sampling rules; and
executing, based on the sampling rule, a symmetric read sample offset sampling operation to calibrate the memory sub-system.

17. The method of claim 16, wherein the threshold value is zero, and wherein the occurrence of the center read sample on the sidewall is identified in view of the difference error count having a value less than the threshold value.

18. The method of claim 16, further comprising executing the symmetric read sample offset sampling operation by placing a subsequent center read sample at an offset value location that is equidistant from a subsequent left read sample and a subsequent right read sample.

19. The method of claim 18, wherein a first margin between the subsequent center read sample and the subsequent left read sample equals a second margin between the subsequent center read sample and the subsequent right read sample.

20. The method of claim 19, further comprising
adding a bias value of error counts to the left error count of the asymmetric read sample offset sampling operation; and
executing the symmetric read sample offset sampling operation to produce a subsequent left error count that equals a subsequent right error count.

* * * * *